United States Patent
Xu et al.

(10) Patent No.: US 10,214,340 B2
(45) Date of Patent: Feb. 26, 2019

(54) CONTAINERS FOR HOLDING AND DISPENSING STACKS OF ELECTRONIC DEVICE COMPONENTS

(71) Applicant: Intel Corporation, Santa Clara, CA (US)

(72) Inventors: Mingjie Xu, Chandler, AZ (US); Pan Gu, Chandler, AZ (US); Bassam M. Ziadeh, Laveen, AZ (US); Michael Garcia, Chandler, AZ (US); Zhizhong Tang, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/201,372

(22) Filed: Jul. 1, 2016

(65) Prior Publication Data
US 2018/0002101 A1   Jan. 4, 2018

(51) Int. Cl.
*B65D 83/08* (2006.01)
*H05K 13/00* (2006.01)
(Continued)

(52) U.S. Cl.
CPC .......... *B65D 83/0811* (2013.01); *B65D 85/62* (2013.01); *H05K 13/0084* (2013.01);
(Continued)

(58) Field of Classification Search
CPC . B65D 85/62; B65D 83/0811; H05K 13/0084
(Continued)

(56) References Cited

U.S. PATENT DOCUMENTS 3,090,523 A * 5/1963 Packman ............ A23G 7/0025
                                                       221/211
3,854,625 A * 12/1974 Kuebler ............ B65D 83/0409
                                                       221/198
(Continued)

FOREIGN PATENT DOCUMENTS

DE     3040357 A1     5/1982
DE     3610668 A1    10/1987
(Continued)

OTHER PUBLICATIONS

International Search Report dated Aug. 25, 2017; for PCT Application No. PCT/US17/35771; filed Jun. 2, 2017; 13 pages.

*Primary Examiner* — Rakesh Kumar
(74) *Attorney, Agent, or Firm* — Thorpe North & Western, LLP; David W. Osborne

(57) ABSTRACT

A container assembly and system for dispensing a stack of electronic device components includes an elongated tube having a cavity configured to contain a stack of said components. The tube has a dispensing end opposite an access end and a dispenser opening sized to dispense the electronic device components. The access end has an access opening sized to allow entry of a press to push the stack upwardly. A retainer is positioned proximate the access end to engage a last component in the stack and prevent it from exiting the tube through the access opening. The retainer may include a plurality of retainers. The retainer(s) can be a pair of retainers, four retainers, a chamfer formed in the tube, a perimeter insert, and/or a slidable panel. A method of making and a method of dispensing are provided.

20 Claims, 5 Drawing Sheets

(51) Int. Cl.
*B65D 85/62* (2006.01)
*H05K 13/04* (2006.01)
*H01L 23/40* (2006.01)

(52) U.S. Cl.
CPC .. *H05K 13/0434* (2013.01); *H01L 2023/4075* (2013.01); *H01L 2023/4087* (2013.01); *H01L 2924/0002* (2013.01)

(58) Field of Classification Search
USPC ............................... 414/778, 788.4; 221/251
See application file for complete search history.

(56) References Cited

U.S. PATENT DOCUMENTS

| | | | | |
|---|---|---|---|---|
| 4,043,485 | A * | 8/1977 | Tippetts | H05K 13/0084 206/499 |
| 4,113,143 | A * | 9/1978 | Spagnola, Jr. | A63F 11/0002 221/267 |
| 4,142,863 | A * | 3/1979 | Covington | B01L 9/52 221/198 |
| 4,172,523 | A * | 10/1979 | Weglage | B25B 27/20 206/230 |
| 4,353,481 | A * | 10/1982 | Tando | H05K 13/0084 206/499 |
| 4,359,157 | A * | 11/1982 | Horstmann | B65D 59/04 206/718 |
| 4,393,579 | A * | 7/1983 | Van Hooreweder | H01L 21/67144 29/740 |
| 4,632,621 | A | 12/1986 | Cable | |
| 4,635,794 | A * | 1/1987 | Lemmer | H05K 13/0084 206/340 |
| 4,817,818 | A * | 4/1989 | Lockhart | A47F 1/08 221/1 |
| 5,230,440 | A * | 7/1993 | Kurokawa | B65D 83/0418 221/198 |
| 5,325,993 | A * | 7/1994 | Cooper, III | A21C 9/083 221/211 |
| 5,335,816 | A * | 8/1994 | Kaufman | A61J 7/0481 221/124 |
| 5,599,505 | A * | 2/1997 | Fujisaki | B01L 9/52 206/499 |
| 6,638,003 | B2 * | 10/2003 | Yuyama | B65G 59/106 221/251 |
| 6,840,402 | B2 * | 1/2005 | Lin | G01J 5/021 221/198 |
| 7,083,066 | B2 * | 8/2006 | Neveu | A47K 10/424 221/45 |
| 8,061,556 | B2 * | 11/2011 | Sands | F25D 25/005 206/499 |
| 2003/0106866 | A1 | 6/2003 | Chuang | |
| 2009/0035119 | A1 * | 2/2009 | Sugiyama | G11B 5/455 414/788.1 |
| 2013/0020342 | A1 * | 1/2013 | Cardoso | B65D 81/3802 221/1 |

FOREIGN PATENT DOCUMENTS

| | | | |
|---|---|---|---|
| EP | 0986942 A1 | 3/2000 | |
| EP | 2293662 A1 | 3/2011 | |
| JP | S5790323 A | 6/1982 | |
| JP | 2004345063 A * | 12/2004 | ............. B65G 65/00 |

* cited by examiner

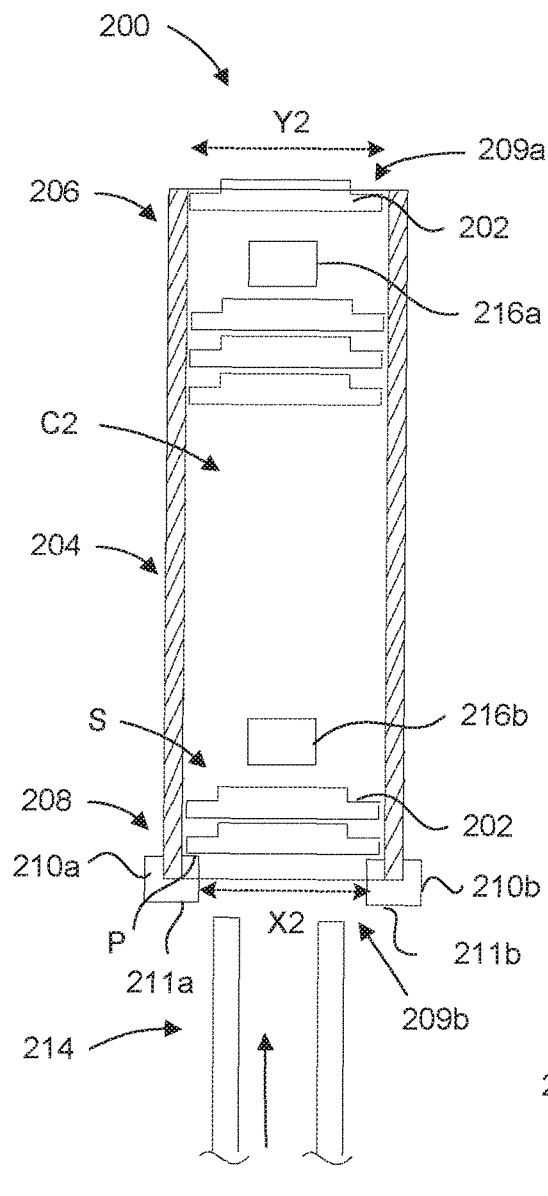
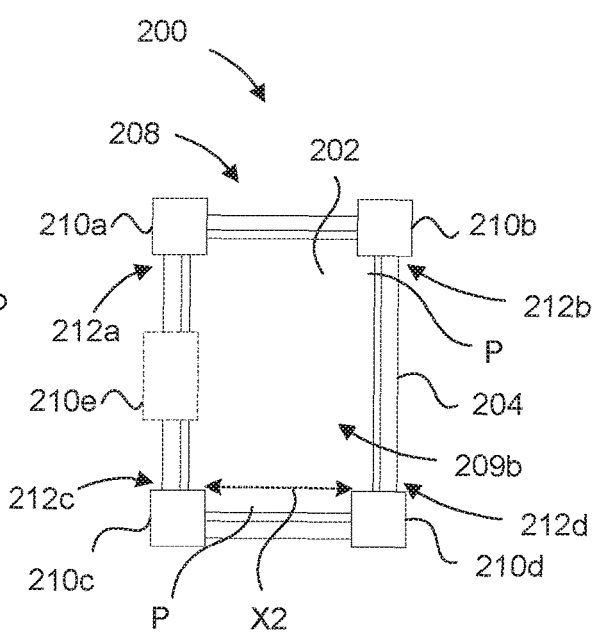
FIG. 2A
FIG. 2B

CONTAINERS FOR HOLDING AND DISPENSING STACKS OF ELECTRONIC DEVICE COMPONENTS

TECHNICAL FIELD

Embodiments described herein relate generally to containers, and more particularly to containers for holding and dispensing a stack of electronic device components.

BACKGROUND

Electronic device components, such as heatsink lids, are packaged and provided to manufacturing customers, typically in a stacked configuration in a tube container. These containers may be used by the customers to hold and dispense single electronic device components therefrom during a manufacturing event. However, as components shrink in size, challenges in dispensing them from a container can occur. For example, clearance tolerances between an inside wall of the container and the edge of the components therein are smaller. This can be problematic for tooling that access and moves the components out of the container.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein:

FIG. 2A shows a cross-sectional view of a container assembly in accordance with one example.

FIG. 2B is a bottom view of the assembly of FIG. 2A.

Figures 1A, 1B:
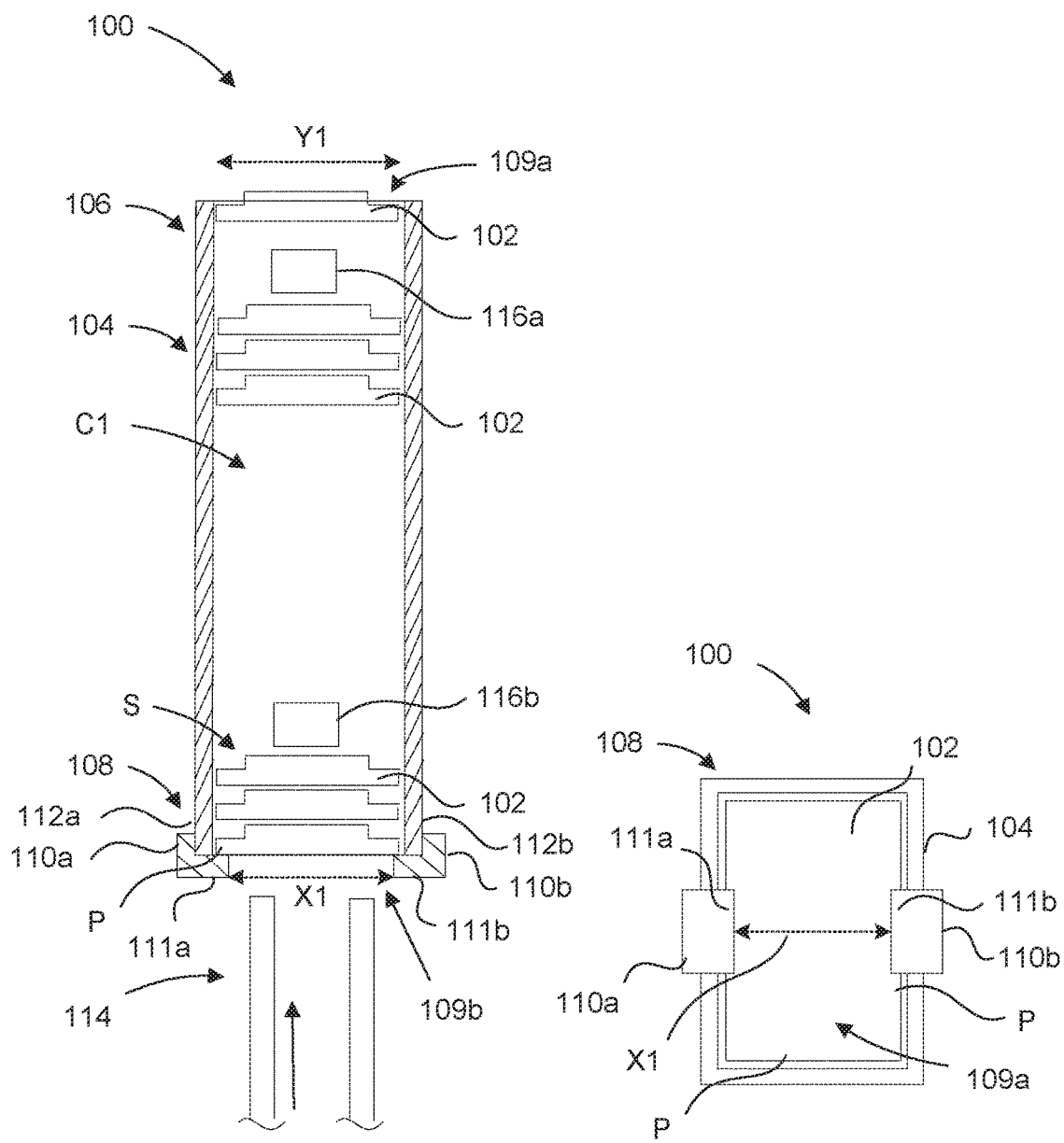
FIG. 1A shows a cross-sectional view of a container assembly in accordance with one example.
FIG. 1B is a bottom view of the assembly of FIG. 1A.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. patent law. "Consisting essentially of" or "consists essentially of" have the meaning generally ascribed to them by U.S. patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. "Directly coupled" a coupling made through direct physical contact. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

A container assembly and system for dispensing a stack of electronic device components includes an elongated tube having a cavity configured to contain a stack of said components. The tube has a dispensing end opposite an access end and a dispenser opening sized to dispense the electronic device components. The access end has an access opening sized to allow entry of a press to push the stack upwardly. A retainer is positioned proximate the access end to engage a last component in the stack and prevent it from exiting the tube through the access opening. The retainer may include a plurality of retainers. The retainer(s) can be a pair of retainers, four retainers, a chamfer formed in the tube, a perimeter insert, and/or a slidable panel among others. Methods of making a container and of dispensing electronic device components from the container are also provided.

FIG. 1A shows a cross-sectional view of a container assembly 100 for holding and dispensing a stack S of electronic device components 102 via a tube 104 in accordance with an example. FIG. 1B is a bottom view of the assembly of FIG. 1A. The tube 104 may be an elongated tube having a cavity C1. The tube 104 may have a dispensing end 106 opposite an access end 108. The dispensing end 106 has a dispenser opening 109a sized to individually dispense the stack S of the electronic device components 102 during a process of manufacturing an electronic device or assembly, for example. In one example, the electronic device components 102 may be metal heatsink lids that are individually removed by a machine about the dispensing end 106, for example. It should be noted that the figures of the present disclosure each may show a few electronic device components (or heatsink lids) in dashed lines inside the cavity for illustration purposes, but in actual use, there would be a full stack of electronic device components in a vertical arrangement in each tube. In the present disclosure, the tubes and the electronic device components therein have square or rectangular cross sections, but the tubes may be circular or other shape required to accommodate a specific electronic device component and be able to contain and dispense the component held therein.

Positioned proximate the access end 108 may be a retainer configured to retain the electronic device components 102 in the cavity by engaging a last component in the stack to prevent it from exiting the tube through the access opening 109b. In the example of FIG. 1A, the retainer 110 is a pair of retainers 110a and 110b respectively attached to a left edge 112a and a right edge 112b of the tube 104 proximate the access end 108. The retainers 110a and 110b may be straddled about their respective edges. The retainers 110a and 110b may be either removably attached (for example by a friction fit or magnetic or other force sufficient to hold the retainers in place during use) or permanently attached to their respective edges. If they are to be permanently in place, then they will be attached to the tube after the electronic device components have been inserted. Each retainer 110a and 110b can have a flange portion 111a and 111b (respectively) that each extends inwardly about the cavity C1. As such, each retainer 110a and 110b protrudes into a space of the cavity C1 falling within a perimeter P defined by an outside edge of the last (lower) electronic device component in the stack S. The retainers 110a, 110b are configured in this way to define an access opening 109b having a smaller cross-sectional area than that of the dispenser opening 109a (this is best illustrated by the distance represented by arrows X1 of FIGS. 1A and 1B, as compared to the longer distance represented by arrows Y1 of the dispensing end 106). The access opening 109b further defines a smaller cross sectional area than a lower surface area of each of the electronic device components 102. This allows the stack of electronic device components 102 to rest against the retainers 110a and 110b, about a perimeter P of the last component, during shipping and before dispensing of the electronic device components 102 to contain the components in the tube 104.

The configuration of the access opening 109b and the retainers 111a and 111b also provides a relatively large effective central opening to allow a dispensing press 114 to pass through the access opening 109b. In other words, because the central cross-sectional area of the cavity is open near opening 109b (i.e., devoid of attached retainers or other devices disposed horizontally through the tube), the press 114 can freely traverse about said central cross-sectional area of the tube 104. The press 114 may then push or bias the stack of electronic device components 102 upwardly to the dispensing end 106 for individual dispensing therethrough. In this example, the press 114 is shown as a pair of posts. The configuration of the access opening 109b is important when dispensing very small electronic device components, for example, because it facilitates dispensing with optimized press clearance while avoiding damaging the components 102 during dispensing.

In some examples, the tube 104 may include an upper keyhole 116a and a lower keyhole 116b that each extend through opposing walls of the tube 104. The upper keyhole 116a may receive a key (not shown) inserted through the tube 104 after a stack of electronic device components 102 are stacked in the cavity C1 and prepared for delivery to an electronics manufacturer, for instance. The key in the upper keyhole 116a would be removed before dispensing the electronic device components 102 from the tube 104.

FIG. 2A shows a cross-sectional view of a container assembly 200 for holding and dispensing a stack S of electronic device components 202 via a tube 204 in accordance with an example. FIG. 2B is a bottom view of the assembly of FIG. 2A. The tube 204 may be an elongated tube having a cavity C2. The tube 204 may have a dispensing end 206 opposite an access end 208. The dispensing end 206 has a dispenser opening 209a sized to individually dispense the stack S of the electronic device components 202 during a process of manufacturing an electronics assembly, for example. In one example, the electronic device components 202 may be metal heatsink lids that are individually removed by a machine at the dispensing end 206.

Positioned proximate the access end 208 may be a retainer configured to retain the electronic device components 202 in the cavity by engaging a last component in the stack S to prevent it from exiting the tube through the access opening 209b. In the example of FIG. 2A, the retainer is four retainers or retainer members 210a-d attached to corner edges 212a-d (FIG. 2A), respectively, of the tube 204 proximate the access end 208. In an example, the retainers 210a-d may be straddled about 90 degree sides of the corner edges 212a-d of the tube 204. The retainers 210a-d may be either removably attached (again by a friction or magnetic force, etc.) or permanently attached to respective corner edges 212a-d. Each retainer 210 may have a flange portion 211a-d (FIG. 2A) that each extends inwardly about the cavity C2. As such, each retainer 210a-d protrudes into a space of the cavity C2 falling within a perimeter P defined by an outside edge of the last (lower) electronic device component in the stack S. The retainers 210a-d are configured in this way to define an access opening 209b defining a smaller cross-sectional area than that of the dispenser opening 209a (this is best illustrated by the distance represented by arrows X2 of FIGS. 2A and 2B, as compared to the longer distance represented by arrows Y2 at the dispensing end 206). The access opening 209b further defines a smaller cross-sectional area than a lower surface area of each electronic device components 202. This allows the stack of electronic device components 202 to rest against the retainers 210a-d, about a perimeter P of the last component, during shipping and before dispensing of the electronic device components 202 to contain the components in the tube 204. In one alternate example, four retainers can be attached to opposing side edges of the tube, as illustrated by a single retainer 210e shown in dashed lines and straddling a side edge of the tube 204. In an additional embodiment, only two or three retainers can be attached at corners of the tube.

The configuration of the access opening 209b and the retainers 210a-d further provides a relatively large effective opening to allow a dispensing press 214 to pass through the access opening 209b. In other words, because the central cross-sectional area of the cavity of the tube is open (i.e., devoid of attached retainers or other devices extending horizontally through the tube), the press 214 may freely traverse about the central area of the tube 204. The press 214 may then push or bias the electronic device components 202 upwardly to the dispensing end 206 for individual dispensing therethrough. In this example, the press 214 is a pair posts. The access opening 209b and retainer configuration is important when dispensing very small electronic device components, for example, because it facilitates dispensing with optimized press clearance while avoiding damaging the components 202 during dispensing.

In some examples, the tube 204 may include an upper keyhole 216a and a lower keyhole 216b that each extend through opposing walls of the tube 204. The upper keyhole 216a may receive a key (not shown) inserted through the tube 204 after a stack of electronic device components 202 are stacked in the cavity C2 and prepared for delivery to an electronics manufacturer, for instance. The key in the upper keyhole 216a would be removed before dispensing the electronic device components 202 from the tube 204.

Figure 3A:
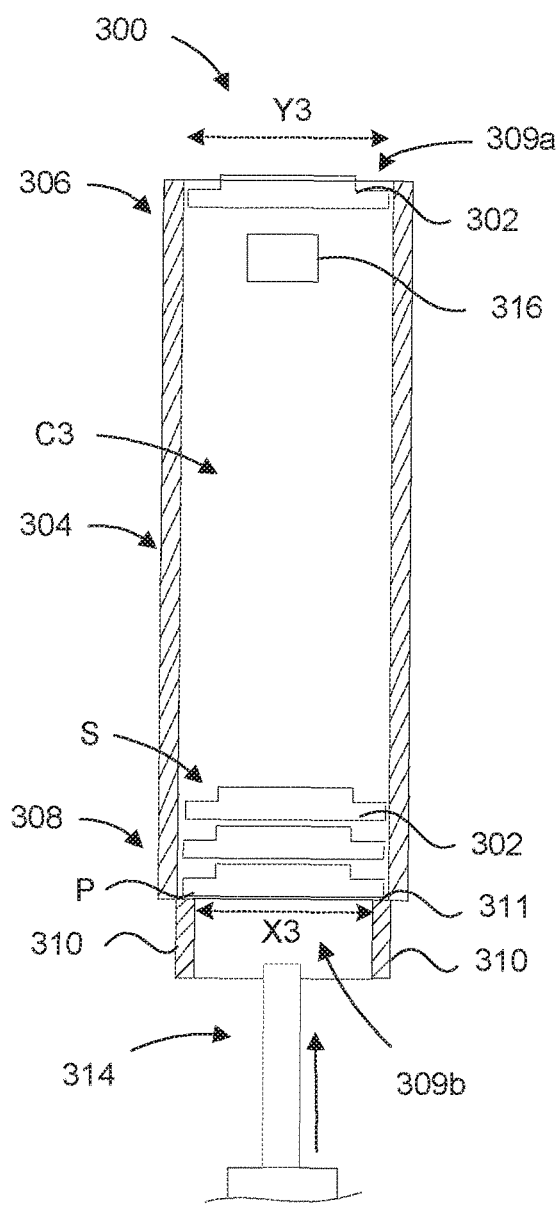
FIG. 3A shows a cross-sectional view of a container assembly in accordance with one example.
Figure 3B:
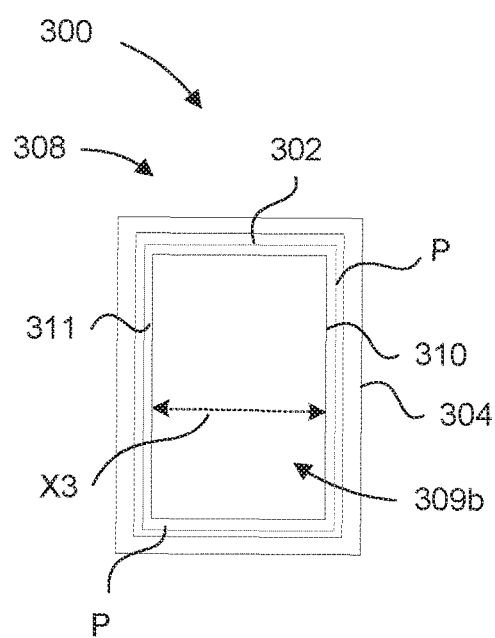
FIG. 3B is a bottom view of the assembly of FIG. 3A.

FIG. 3A shows a cross-sectional view of a container assembly 300 for holding and dispensing a stack S of electronic device components 302 via a tube 304 in accordance with an example. FIG. 3B is a bottom view of the assembly of FIG. 3A. The tube 304 may be an elongated tube having a cavity C3. The tube 304 may have a dispensing end 306 opposite an access end 308. The dispensing end 306 has a dispenser opening 309a sized to individually dispense the electronic device components 302 during a process of manufacturing an electronics assembly, for example. In one example, the electronic device components 302 may be metal heatsink lids that are individually removed by a machine about the dispensing end 306.

Positioned proximate the access end 308 may be a retainer configured to retain the electronic device components 302 in the cavity by engaging a last component in the stack and prevent it from exiting the tube through the access opening 309b. In the example of FIG. 3A, the retainer is a chamfer portion 310 formed integral with the tube 304 (or it can be an attached separately to the tube) proximate the access end 308. The chamfer portion 310 is disposed a predetermined distance into the cavity C3 of the tube 304. The chamfer portion 310 is formed (or attached) having an access opening 309b defining a smaller cross-sectional area than that of the dispenser opening 309a (this is best illustrated by the distance represented by arrows X3 of FIGS. 3A and 3B, as compared to the longer distance represented by arrows Y3 of the dispensing end 306). The access opening 309b further defines a smaller cross-sectional area than a lower surface area of each of the electronic device components 302. As such, the chamfer portion 310 protrudes into a space of the cavity C3 falling within a perimeter P defined by an outside edge of the last (lower) electronic device component in the stack S. This allows the stack of electronic device components 302 to rest against an upper edge or perimeter portion 311 of the chamfer portion 310, about a perimeter P of the last component, during shipping and before dispensing of the electronic device components 302 to contain the components in the tube 304.

The configuration of the access opening 309b and the chamfer portion 310 also provides a relatively large effective central area to allow a dispensing press 314 to pass through the access opening 309b. In other words, because the central area of the cavity of the tube is open (i.e., void of attached retainers or other devices extending horizontally through the tube), the press 314 may freely traverse about the central area of the tube 304. The press 314 may then push or bias the electronic device components 302 upwardly to the dispensing end 306 for individual dispensing therethrough. In this example, the press 314 is a single push member. The access opening 309b (providing the relatively large opening to allow the press 314 to pass through) is important when dispensing very small electronic device components, for example, because it facilitates dispensing with optimized press clearance while avoiding damaging the components 302 during dispensing.

In some examples, the tube 304 may include an upper keyhole 316 extends through opposing walls of the tube 304. The upper keyhole 316 may receive a key (not shown) inserted through the tube 304 after a stack of electronic device components 302 are stacked in the cavity C3 and prepared for delivery to an electronics manufacturer, for instance. The key in the upper keyhole 316a would be removed before dispensing the electronic device components 302 from the tube 304.

Figure 4A:
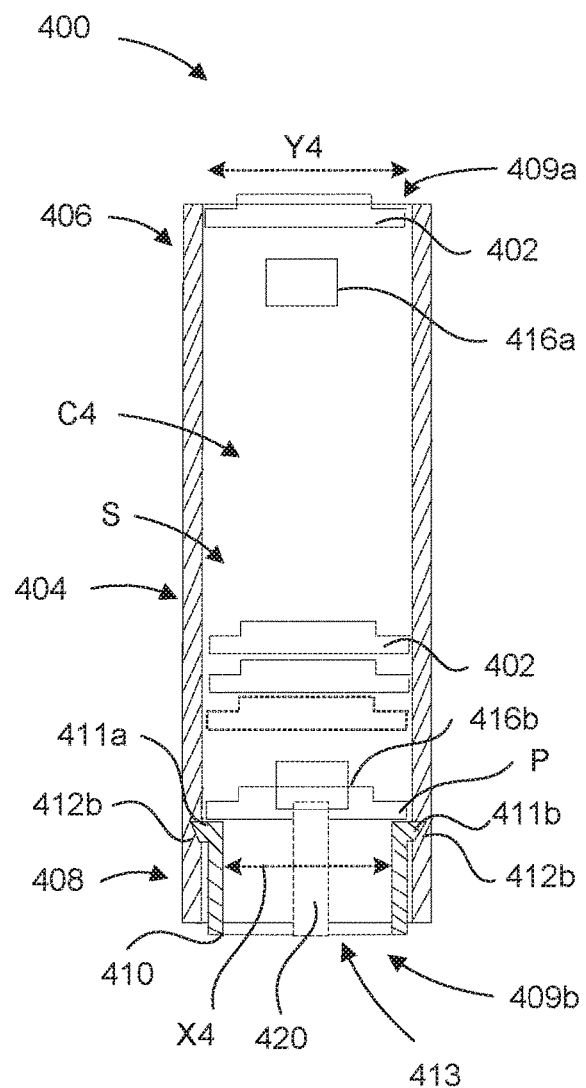
FIG. 4A shows a cross-sectional view of a container assembly in accordance with one example.
Figure 4B:
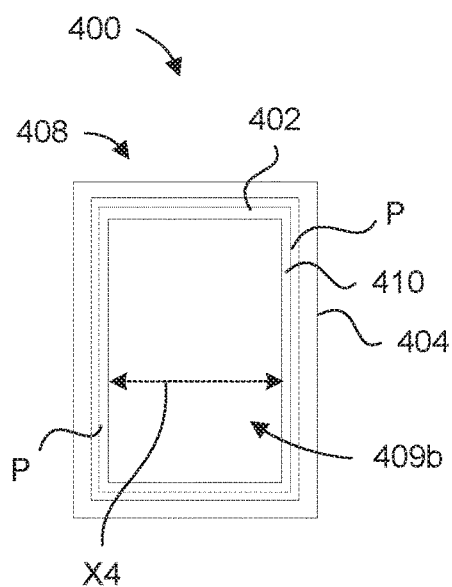
FIG. 4B is a bottom view of the assembly of FIG. 4A.

FIG. 4A shows a cross-sectional view of a container assembly 400 for holding and dispensing a stack S of electronic device components 402 in a tube 404 in accordance with an example. FIG. 4B is a bottom view of the assembly of FIG. 4A. The tube 404 may be an elongated tube having a cavity C4. The tube 404 may have a dispensing end 406 opposite an access end 408. The dispensing end 406 has a dispenser opening 409a sized to individually dispense the electronic device components 402 during a process of manufacturing an electronics assembly, for example. The electronic device components 402 may be metal heatsink lids that are individually removed by a machine about the dispensing end 406.

Positioned proximate the access end 408 may be a retainer configured to retain the electronic device components 402 in the cavity by engaging a last component in the stack and prevent it from exiting the tube through the access opening 409b. In the example of FIG. 4A, the retainer is a perimeter insert 410 attached proximate the access end 408. The perimeter insert 410 is positioned statically within the cavity C3 and has a pair of flanges 411a and 411b that may be mated to corresponding openings 412a and 412b formed in sides of the tube 404. The flanges 411a and 411b protrude a predetermined distance into the cavity C4 of the tube 404. The electronic device components 402 can be supported by the perimeter insert 410 proximate the flanges 411a and 411b, similar to that of FIGS. 1A and 2A. As such, the perimeter insert 410 protrudes into a space of the cavity C4 falling within a perimeter P defined by an outside edge of the last (lower) electronic device component in the stack S. Thus, the perimeter insert 410 is configured in this way to define the access opening 409b having a smaller cross-sectional area than that of the dispenser opening 409a (this is best illustrated by the distance represented by arrows X4 of FIGS. 4A and 4B, as compared to the longer distance represented by arrows Y4 of the dispensing end 406). The access opening 409b further defines a smaller cross-sectional area than a lower surface area of each of the electronic device components 402. This allows the stack of electronic device components 402 to rest against and be supported by the perimeter insert 410, about a perimeter P of the last component, during shipping and before dispensing of the electronic device components 402 in order to contain the components in the tube 404.

The configuration of the access opening 409b and the perimeter insert 410 also provides a relatively large effective opening to allow a dispensing press (shown elsewhere) to pass through the access opening 409b. In other words, because the central area of the cavity of the tube is open (i.e., devoid of attached retainers or other devices that extend horizontally through the tube), a press (not shown here but elsewhere) may freely traverse about the central area of the tube 404. The press may then push or bias the electronic device components 402 upwardly to the dispensing end 406 for individual dispensing therethrough. The access opening 409b (providing the relatively large opening to allow the press to pass through) is important when dispensing very small electronic device components, for example, because it facilitates dispensing with optimized press clearance while avoiding damaging the components 402 during dispensing.

In some examples, the tube 404 may include upper keyholes 416a and a lower keyholes 416b that each extend through opposing walls of the tube 404. The upper keyholes 416a may receive a key, as previously discussed. The lower keyholes 416b may be optionally used to attach a retention device thereto (also possible with the examples of other Figures). In the example of FIG. 4A, a pair of attachment members 420 can extend from the retainer 410 and are each attached to the lower keyholes 416b, such as by a hook and hole configuration (only one member 420 can be shown on FIG. 4, but it will be appreciated that there could be a pair of attachment members coupled to respective lower keyholes of the tube 404).

Figure 5A:
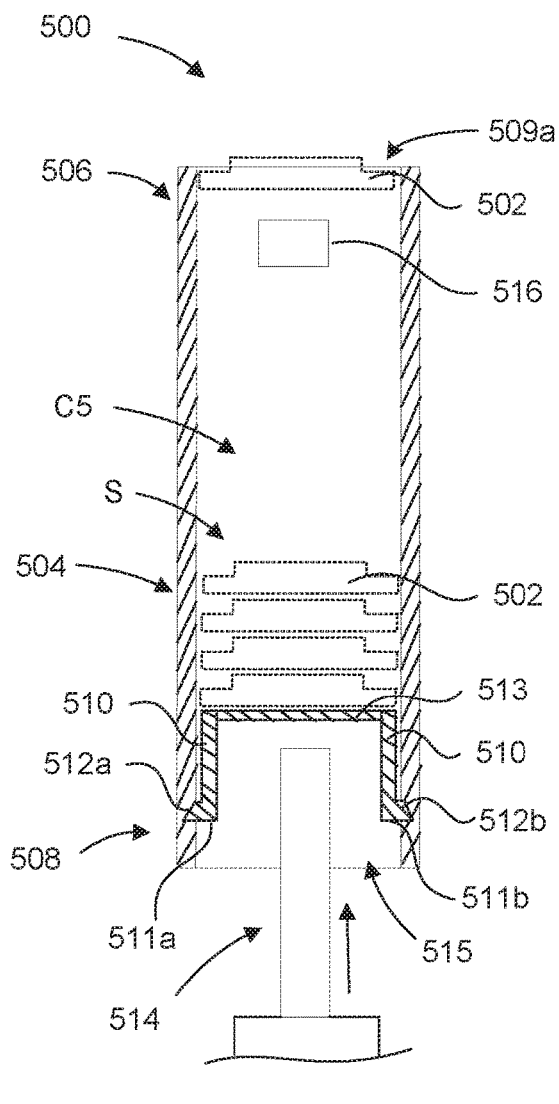
FIG. 5A shows a cross-sectional view of a container assembly in accordance with one example.
Figure 5B:
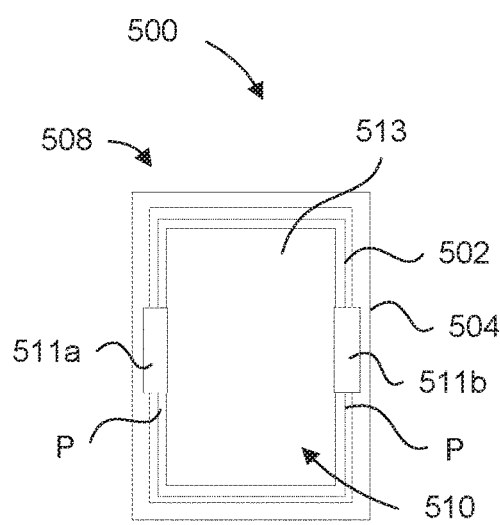
FIG. 5B is a bottom view of the assembly of FIG. 5A.

FIG. 5A shows a cross-sectional view of a container assembly 500 for holding and dispensing a stack S of electronic device components 502 via a tube 504 in accordance with an example. FIG. 5B is a bottom view of the assembly of FIG. 5A. The tube 504 may be an elongated tube having a cavity C5. The tube 504 may have a dispensing end 506 opposite an access end 508. The dispensing end 506 has a dispenser opening 509a sized to individually dispense the electronic device components 502 during a process of manufacturing an electronics assembly, for example. In one example, the electronic device components 502 may be metal heatsink lids that are individually removed by a machine about the dispensing end 506.

Positioned proximate the access end 508 may be a retainer configured to retain the electronic device components 502 in the cavity by engaging a last component in the stack and prevent it from exiting the tube through the access opening 509b. In the example of FIG. 5A, the retainer is a slidable panel 510 attached proximate the access end 508. The slidable panel 510 is movably positioned within the cavity C5 and has a pair of flanges 511a and 511b that are mated to corresponding openings 512a, 512b formed about inner walls of the tube 504. The slidable panel 510 may have a surface 513 formed between the flanges 511a and 511b. The last component of the stack of electronic device components 502 can be supported about the surface 513 of the slidable panel 510. The slidable panel 510 is slidably engaged within the cavity C5 and frictionally coupled to the inner surface of the tube 504. A dispensing press 514 may pass through a central opening 515 of the tube 504 and engage against the slidable panel 510 to push it upwardly, which consequently upwardly pushes the stack of electronic device components 502 for dispensing through the dispensing end 506. The openings 512a and 512b may prevent the device 510 and the stacked electronic device components 502 thereon from falling downwardly while allowing them to be pushed upwardly by the press 514. The slidable panel 510 may be made of a plastic or other material that is sufficiently rigid to support the electronic device components 502 while coupled to the openings 512a and 512b, but flexible enough to allow the flanges to compress inwardly as the press 514 pushes the platform upwardly during use. The slidable panel 510 is important when dispensing very small electronic device components, for example, because it facilitates dispensing with optimized press clearance while avoiding contacting and/or damaging the components 502 with the press 514 during dispensing.

In some examples, the tube 504 may include an upper keyhole 516 that extends through opposing walls of the tube 504. The upper keyhole 516 may receive a key, as previously discussed.

EXAMPLES

The following examples pertain to further embodiments.

In one example there is provided, a container for holding and dispensing electronic device components. The container comprises an elongated tube having a cavity configured to contain a stack of electronic device components. The tube has a dispensing end opposite an access end and the dispensing end has a dispenser opening sized to dispense the electronic device components. The access end has an access opening sized to allow entry of a press. A retainer is positioned proximate the access end to engage a last component in the stack and prevent it from exiting the tube through the access opening. Said retainer is either fixedly coupled to the tube and configured to engage only a periphery of the last electronic device component, or coupled to the tube in a longitudinally movable manner.

In one example of the container, the retainer extends from the tube and protrudes into a space of the cavity falling within a perimeter defined by an outside edge of the last electronic device component in the stack.

In one example of the container, the retainer comprises a plurality of retainers attached about an edge of the access end of the tube.

In one example of the container, the retainers straddle an edge of the tube.

In one example of the container, the retainers are held in place about the edge of the access end of the tube by a frictional force.

In one example of the container, the plurality of retainers comprises a pair of retainers.

In one example of the container, each retainer is attached at substantially the same position and opposing each other.

In one example of the container, each retainer is either removably attached or permanently attached to the edge of the access end.

In one example of the container, the tube has a square cross section and the plurality of retainers is attached to corners of the access end.

In one example of the container, the plurality of retainers is four retainers attached to corners of the edge of the access end.

In one example of the container, the plurality of retainers is four support devices attached to opposing sides of the edge of the access end.

In one example of the container, the retainer is a chamfer formed integral with the tube proximate the access end.

In one example of the container, the chamfer is formed a predetermined distance into the cavity of the tube.

In one example of the container, the chamfer defines a cross-sectional area smaller than a cross-sectional area of the tube.

In one example of the container, the retainer is a perimeter insert attached proximate the access end.

In one example of the container, the perimeter insert includes a pair of flange portions mated to corresponding openings of the elongated tube.

In one example of the container, the perimeter insert has a surface that protrudes a predetermined distance into the cavity of the tube.

In one example of the container, the retainer is a slidable panel attached proximate the access end.

In one example of the container, the panel has a surface to support the electronic device components and a pair of flanges engaged to an inner wall of the elongated tube.

In one example of the container, the panel has a central opening to allow passage of the press to directly engage the surface to press the stack upwardly.

In one example of the container, the surface of the panel is sized to support a surface of the last component of the stack.

In one example of the container, the elongated tube includes a pair of holes formed transverse through the tube and proximate the access end, and wherein the retainer is selectively engaged to the pair of holes.

In one example there is provided, a container assembly for dispensing a plurality of electronic device components. The assembly comprises an elongated tube having a cavity extending therethrough and a plurality of electronic device components contained within the cavity. A dispensing end of the elongated tube has a dispenser opening sized to dispense the electronic device components, and an access end of the elongated tube is positioned opposite the dispensing end and having an access opening sized to allow entry of a press. A retainer is positioned proximate the access end to engage a last component in the stack and prevent it from exiting the tube through the access opening. Said retainer is either fixedly coupled to the tube and configured to engage only a periphery of the last electronic device component, or coupled to the tube in a longitudinally movable manner.

In one example of the container assembly, the retainer extends from the tube and protrudes into a space of the cavity falling within a perimeter defined by an outside edge of the last electronic device component in the stack.

In one example of the container assembly, the retainer comprises a plurality of retainers attached about an edge of the access end of the tube.

In one example of the container assembly, the retainers straddle an edge of the tube.

In one example of the container assembly, the retainers are held in place about the edge of the access end of the tube by a frictional force.

In one example of the container assembly, the plurality of retainers comprises a pair of retainers.

In one example of the container assembly, each retainer is attached at substantially the same position and opposing each other.

In one example of the container assembly, each retainer is either removably attached or permanently attached to the edge of the access end.

In one example of the container assembly, the tube has a square cross section and the plurality of retainers is attached to corners of the access end.

In one example of the container assembly, the plurality of retainers is four retainers attached to corners of the edge of the access end.

In one example of the container assembly, the plurality of retainers is four retainers attached to opposing sides of the edge of the access end.

In one example of the container assembly, the retainer is a chamfer formed integral with the tube proximate the access end.

In one example of the container assembly, the chamfer is formed a predetermined distance into the cavity of the tube.

In one example of the container assembly, the chamfer defines a cross-sectional area smaller than a cross-sectional area of the tube.

In one example of the container assembly, the retainer is a perimeter insert attached proximate the access end.

In one example of the container assembly, the perimeter insert includes a pair of flange portions mated to corresponding openings of the elongated tube.

In one example of the container assembly, the perimeter insert has a surface that protrudes a predetermined distance into the cavity of the tube.

In one example of the container assembly, the retainer is a slidable panel attached proximate the access end.

In one example of the container assembly, the panel has a surface to support the electronic device components and a pair of flanges engaged to an inner wall of the elongated tube.

In one example of the container assembly, the panel has a central opening to allow passage of the press to directly engage the surface to press the stack upwardly.

In one example of the container assembly, the surface of the panel is sized to support a surface of the last component of the stack.

In one example of the container assembly, the elongated tube includes a pair of holes formed transverse through the tube and proximate the access end, and wherein the retainer is selectively engaged to the pair of holes.

In one example of the container assembly, each electronic device component is a metal heatsink lid attachable to an electrical device.

In one example there is provided, a dispensing system to facilitate dispensing of electronic device components from a tube. The system comprises an elongated tube having a cavity extending therethrough and a plurality of electronic device components stacked vertically within the cavity. A dispensing end of the elongated tube has a dispenser opening to dispense the plurality of electronic device components. An access end of the elongated tube is disposed opposite the dispensing end and having an access opening. A retainer is positioned proximate the access end to engage a last component in the stack and prevent it from exiting the tube through the access opening. Said retainer is either fixedly coupled to the tube and configured to engage only a periphery of the last electronic device component, or coupled to the tube in a longitudinally movable manner. A press extends through the access opening and configured to upwardly push the stack of electronic device components for dispensing through the dispensing end.

In one example of the dispensing system, the retainer extends from the tube and protrudes into a space of the cavity falling within a perimeter defined by an outside edge of the last electronic device component in the stack.

In one example of the dispensing system, the retainer comprises a plurality of retainers attached about an edge of the access end of the tube.

In one example of the dispensing system, the retainers straddle an edge of the tube.

In one example of the dispensing system, the retainers are held in place about the edge of the access end of the tube by a frictional force.

In one example of the dispensing system, the plurality of retainers comprises a pair of retainers.

In one example of the dispensing system, each retainer is attached at substantially the same position and opposing each other.

In one example of the dispensing system, each retainer is either removably attached or permanently attached to the edge of the access end.

In one example of the dispensing system, the tube has a square cross section and the plurality of retainers attached to corners of the access end.

In one example of the dispensing system, the plurality of retainers is four retainers attached to corners of the edge of the access end.

In one example of the dispensing system, the plurality of retainers is four retainers attached to opposing sides of the edge of the access end.

In one example of the dispensing system, the retainer is a chamfer formed integral with the tube proximate the access end.

In one example of the dispensing system, the chamfer is formed a predetermined distance into the cavity of the tube.

In one example of the dispensing system, the chamfer defines a cross-sectional area smaller than a cross-sectional area of the tube.

In one example of the dispensing system, the retainer is a perimeter insert attached proximate the access end.

In one example of the dispensing system, the perimeter insert includes a pair of flange portions mated to corresponding openings of the elongated tube.

In one example of the dispensing system, the perimeter insert has a surface that protrudes a predetermined distance into the cavity of the tube.

In one example of the dispensing system, the retainer is a slidable panel attached proximate the access end.

In one example of the dispensing system, the panel has a surface to support the electronic device components and a pair of flanges engaged to an inner wall of the elongated tube.

In one example of the dispensing system, the panel has a central opening to allow passage of the press to directly engage the surface to press the stack upwardly.

In one example of the dispensing system, the surface of the panel is sized to support a surface of the last component of the stack.

In one example of the dispensing system, the elongated tube includes a pair of holes formed transversely through the tube proximate the access end, and wherein the retainer is selectively engaged to the pair of holes.

In one example of the dispensing system, each electronic device component is a metal heatsink lid attachable to an electrical device.

In one example, there is provided a method for containing and dispensing a stack of electronic device components. The method comprises providing an elongated tube having a cavity configured to contain a stack of electronic device components. The tube has a dispensing end opposite an access end and the dispensing end has a dispenser opening sized to dispense the electronic device components. The access end has an access opening sized to allow entry of a press. The method includes providing a retainer positioned proximate the access end to engage a last component in the stack and prevent it from exiting the tube through the access opening. Said retainer is either fixedly coupled to the tube and configured to engage only a periphery of the last electronic device component, or coupled to the tube in a longitudinally movable manner.

In one example of the method for containing and dispensing, the method includes providing a plurality of electronic device components stacked on top of each other and within the cavity. The retainer extends from the tube and protruding into a space of the cavity falling within a perimeter defined by an outside edge of the last electronic device component in the stack.

In one example of the method for containing and dispensing, the method includes disposing a press through the access opening and biasing it upwardly against the lowermost electronic device component to facilitate dispensing of each electronic device component through the dispensing end.

In one example of the method for containing and dispensing, wherein providing the retainer includes attaching a plurality of retainers about edges of the tube proximate the access end of the tube.

In one example of the method for containing and dispensing, providing the plurality of retainers includes attaching a pair of retainers to the edges of the tube proximate the access end.

In one example of the method for containing and dispensing, providing the plurality of retainers includes attaching each retainer at substantially the same position and opposing each other.

In one example of the method for containing and dispensing, each retainer straddles an edge of the tube.

In one example of the method for containing and dispensing, providing the plurality of retainers includes the retainers being held in place about the edge of the access end of the tube by a frictional force.

In one example of the method for containing and dispensing, providing the plurality of retainers includes removably attaching or permanently attaching the retainers to the edge of the access end.

In one example of the method for containing and dispensing, providing the plurality of retainers includes attaching four retainers to corners of the edge of the access end.

In one example of the method for containing and dispensing, providing the plurality of retainers includes attaching four retainers to sides of the edge of the access end.

In one example of the method for containing and dispensing, providing the retainer includes forming a chamfer integral with the tube proximate the access end.

In one example of the method for containing and dispensing, wherein the chamfer is formed a predetermined distance into the cavity of the tube.

In one example of the method for containing and dispensing, wherein the chamfer defines a cross-sectional area smaller than a cross-sectional area of the tube.

In one example of the method for containing and dispensing, wherein providing the retainer includes attaching a perimeter insert to the tube proximate the access end.

In one example of the method for containing and dispensing, wherein the perimeter insert includes a pair of flange portions mated to corresponding openings of the elongated tube.

In one example of the method for containing and dispensing, wherein the perimeter insert has a surface that protrudes a predetermined distance into the cavity of the tube.

In one example of the method for containing and dispensing, wherein providing the retainer includes coupling a slidable panel in the tube proximate the access end.

In one example of the method for containing and dispensing, the method includes engaging a press against the panel to push the panel and the stack of electronic device components to dispense each electronic device component through the dispensing end.

In one example of the method for containing and dispensing, the method includes forming a pair of holes transversely through the tube proximate the access end and selectively engaging the retainer to the pair of holes.

In one example of the method for containing and dispensing, the method includes inserting a press through the access opening and against the last component in the stack to dispense each electronic device component through the dispensing end.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. A container for holding and dispensing electronic device components, the container comprising:
   an elongated tube having a cavity configured to contain a stack of electronic device components, the tube having a dispensing end opposite an access end, the dispensing end having a dispenser opening sized to dispense the electronic device components, and the access end having an access opening sized to allow entry of a press, wherein the cavity comprises a uniform cross-sectional area that extends from the dispenser opening to the access opening; and
   a plurality of retainers removably attached to the access end and positioned proximate the access end to engage a last component in the stack and prevent it from exiting the tube through the access opening, said plurality of retainers configured to engage only a periphery of the last electronic device component;
   wherein either:
      the plurality of retainers extend from the tube and protrude into a space of the cavity falling within a perimeter defined by an outside edge of the last electric device component in the stack;

the tube has a square cross-section and the plurality of retainers are attached to corners of the access end;

the plurality of retainers is four retainers attached to corners of the edge of the access end; and the four retainers are spatially separated from each other about the access end; or the plurality of retainers extend from the tube and protrudes into a space of the cavity falling within a perimeter defined by an outside edge of the last electric device component in the stack;

the plurality of retainers comprises two pairs of retainers; and each retainer is U-shaped and straddles an edge of the access end of the elongated tube.

2. The container of claim 1, wherein the plurality of retainers is held in place about the edge of the access end of the tube by a frictional force.

3. The container of claim 1, wherein each retainer is attached at substantially the same position and opposing each other.

4. The container of claim 1, wherein the plurality of retainers is four support devices attached to opposing sides of the edge of the access end.

5. The container of claim 1, wherein the retainers straddle an edge of the tube, such that a portion of each retainer extends outwardly from a wall of the tube, and a portion of each retainer extends inwardly from the respective wall of the tube.

6. The container of claim 1, wherein the access opening is sized to permit passage of the electronic device components when the plurality of retainers is removed from the access end.

7. The container of claim 1, wherein the elongated tube is sized to permit passage of the electronic device components through the access opening when the retainer is removed from the access end.

8. The container of claim 1, further comprising at least one keyhole formed through opposing walls of the elongated tube, wherein the at least one keyhole is sized to receive a key insertable through the elongated tube and configured to retain the electronic device components in the cavity prior to dispensing the electronic device components from the elongated tube.

9. The container of claim 8, wherein the at least one keyhole comprises an upper keyhole and a lower keyhole.

10. The container of claim 1, wherein the elongated tube comprises a uniform cross-sectional area along its entire length, such that the access opening is substantially the same size as the dispenser opening.

11. The container of claim 1, wherein the elongated tube includes a pair of holes formed transversely through the tube and proximate the access end.

12. The container of claim 1, wherein the plurality of retainers are permanently attached.

13. The container of claim 1, wherein the plurality of retainers define an access opening having a cross-sectional area that is smaller than a cross-sectional area of the dispenser opening.

14. The container of claim 1, wherein the access opening has a size sufficient to allow entry of a press configured to engage the electronic device components.

15. The container of claim 1, wherein the electronic device components are heat sink lids.

16. The container of claim 1, wherein the plurality of retainers attached to the corners of the access end are straddled about 90 degree sides of the corner edges.

17. The container of claim 1, wherein the access opening has an open central cross section.

18. The container of claim 17, wherein the central cross section is devoid of devices disposed horizontally through the tube.

19. The container of claim 1, wherein the plurality of retainers are held in place by a magnetic force.

20. The container of claim 1, wherein the plurality of retainers are removably attached.

* * * * *